United States Patent [19]

Mirabel

[11] Patent Number: 6,156,609
[45] Date of Patent: Dec. 5, 2000

[54] EEPROM DEVICE MANUFACTURING METHOD

[75] Inventor: Jean-Michel Mirabel, Cabries, France

[73] Assignee: STMicroelectronics S.A., Gentilly, France

[21] Appl. No.: 09/298,233

[22] Filed: Apr. 23, 1999

[30] Foreign Application Priority Data

Apr. 28, 1998 [FR] France ................... 98 056728

[51] Int. Cl.[7] .................................. H01L 21/336
[52] U.S. Cl. .................... 438/257; 438/258; 438/275
[58] Field of Search ..................... 438/257, 258, 438/275

[56] References Cited

U.S. PATENT DOCUMENTS

| | | | |
|---|---|---|---|
| 4,561,170 | 12/1985 | Doering et al. | 29/571 |
| 5,227,326 | 7/1993 | Walker . | |
| 5,296,393 | 3/1994 | Smayling et al. | 437/34 |
| 5,464,784 | 11/1995 | Crisenza et al. . | |
| 5,631,178 | 5/1997 | Vogel et al. . | |
| 5,637,520 | 6/1997 | Cappelletti et al. . | |
| 5,663,080 | 9/1997 | Cereda et al. | 438/450 |
| 5,688,705 | 11/1997 | Bergemont . | |
| 5,696,399 | 12/1997 | Cereda et al. | 257/385 |
| 5,798,279 | 8/1998 | Crisenza et al. . | |
| 6,017,792 | 1/2000 | Sharma et al. . | |
| 6,071,775 | 6/2000 | Choi et al. . | |

OTHER PUBLICATIONS

French Search Report from French Patent Application 98 05628, filed Apr. 28, 1998.

*Primary Examiner*—John F. Niebling
*Assistant Examiner*—Jonathan Hack
*Attorney, Agent, or Firm*—Wolf, Greenfield & Sacks, P.C.; James H. Morris; Theodore E. Galanthay

[57] ABSTRACT

The present invention relates to a method of manufacturing, in a P-type substrate including active areas separated by field oxide areas, heavily-doped stop-channel regions under portions of the field insulation areas, more lightly-doped P- and N-type areas meant to form MOS transistor wells, and heavily-doped N-type areas meant to form the first electrode of a capacitor, including the steps of performing a high energy N-type implantation in P-channel MOS transistor areas; performing a high energy P-type implantation in N-channel MOS transistor areas; performing a high energy P-type implantation in stop-channel areas and in capacitor areas; and performing a low energy N-type implantation, masked by the field oxide.

3 Claims, 2 Drawing Sheets

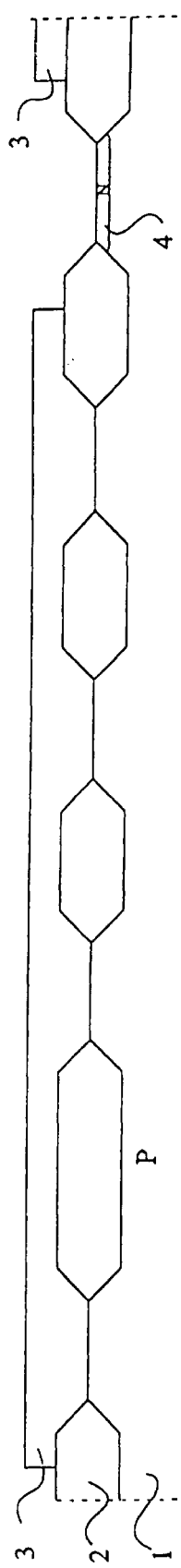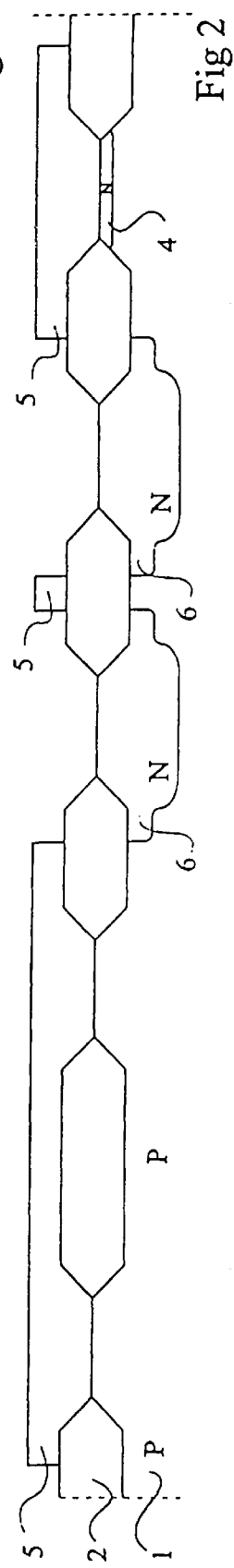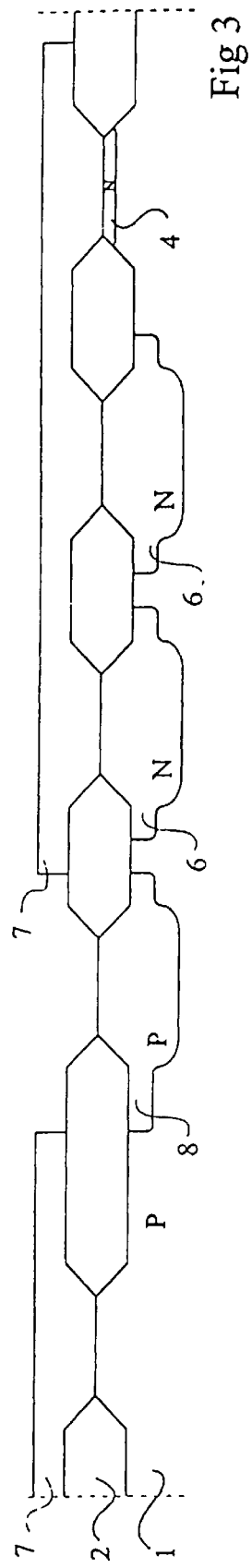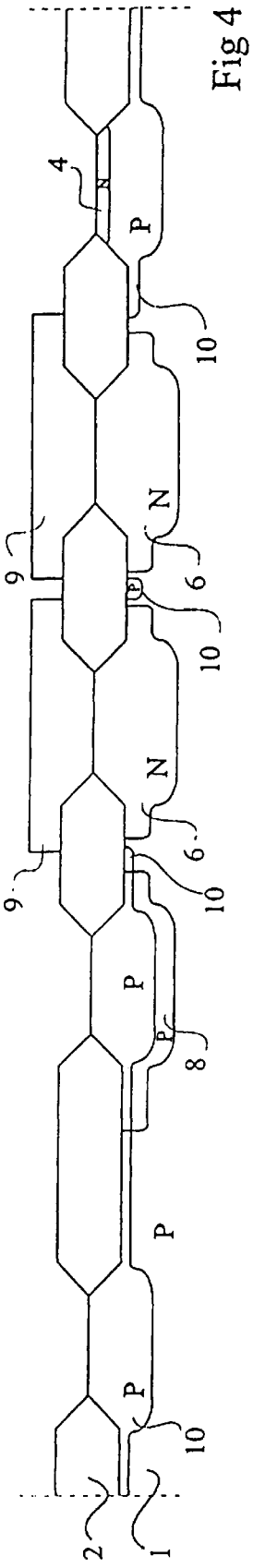

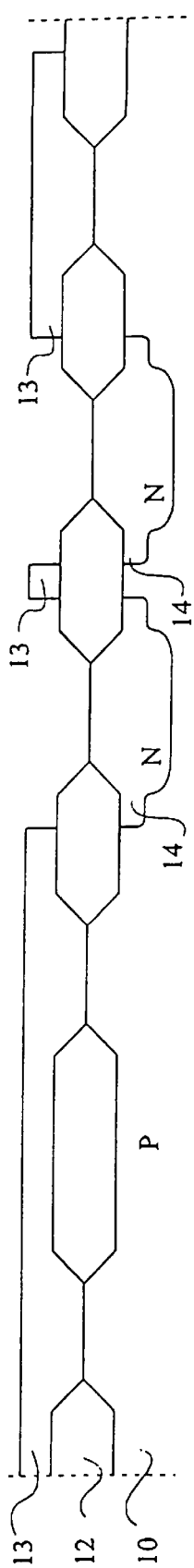
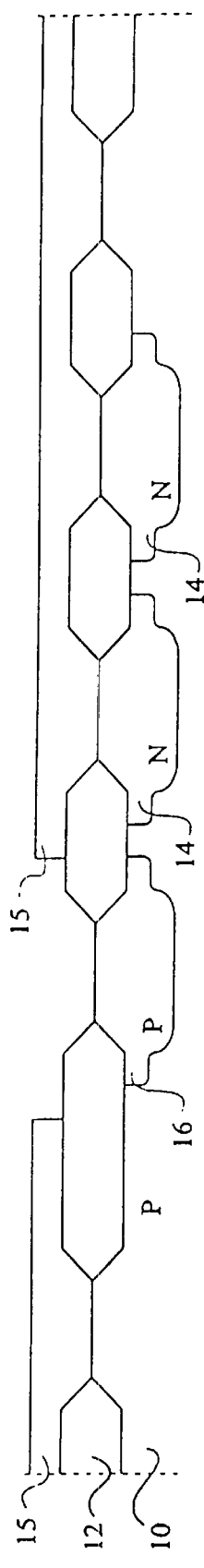
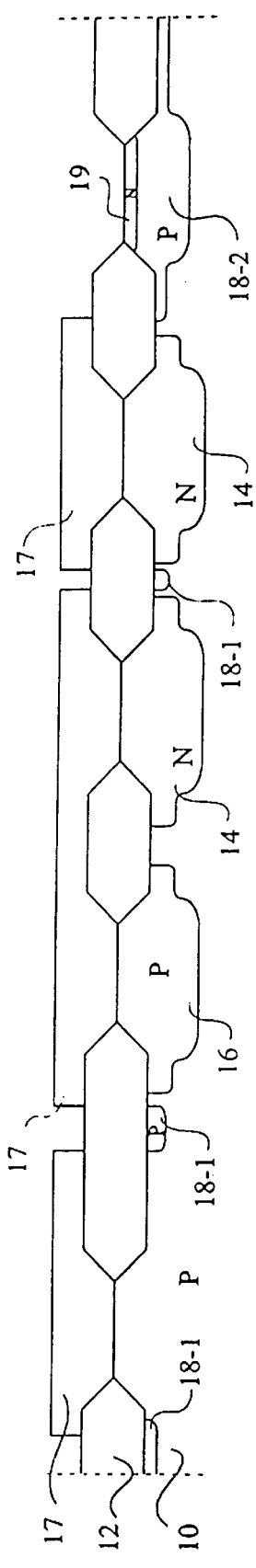

EEPROM DEVICE MANUFACTURING METHOD

BACKGROUND OF THE INVENTION

1. Field of the Invention

The present invention generally relates to the field of semiconductor component manufacturing. More specifically, the present invention relates to the simultaneous manufacturing in a semiconductor substrate, of capacitors, low-voltage transistors and high-voltage transistors, for example, for EEPROM-type memory devices.

2. Discussion of the Related Art

FIGS. 1 to 4 schematically illustrate in cross-section successive steps of a conventional manufacturing method of different semiconductor components on the same substrate.

As illustrated in FIG. 1, a lightly-doped substrate 1 of a first conductivity type (hereafter, type P) in which active areas have been defined between field oxide areas 2 is considered. A first mask 3 is deposited and etched to only expose the areas through which capacitors are to be formed. Then, through the openings of this first mask 3, an N-type dopant is implanted at low energy to create a first electrode 4 of a capacitor.

As illustrated in FIG. 2, after removing the first mask 3, a second mask 5 is deposited and opened to only expose the areas in which low-voltage P-channel transistors are to be formed. Then, a high energy N-type backward implantation is performed through the openings of this second mask 5 to create wells 6 of low voltage P-channel transistors. This implantation crosses the thick oxide and may be followed by another N-type implantation. Conversely to what has been shown, mask region 5 is not necessarily provided above the insulating areas between P-channel transistors. The wells 6 of these P-channel transistors may thus be contiguous.

As illustrated in FIG. 3, after removing second mask 5, a third mask 7 is deposited and opened, to only expose the areas in which the low voltage N-channel transistors are to be formed. Then, a high energy P-type backward implantation is performed through the openings of this third mask 7, to create wells 8 of low voltage N-channel transistors. This implantation crosses the thick oxide.

At the next steps, illustrated in FIG. 4, third mask 7 is removed, a fourth mask 9 is deposited and opened, to only protect the areas in which N-type wells 6 of the low voltage P-channel transistors have been formed. In the embodiment shown, field oxide areas 2 separating two low voltage P-channel transistors are exposed. Then, a high energy P-type backward implantation is performed through the openings of this fourth mask 9, to form heavily-doped regions 10. This implantation crosses the thick oxide. Implantation 10 is formed under the capacitor layers 4, in complement in areas 8 of the low voltage N-channel transistors, as well as in areas of the high voltage N-channel transistors. Further, implantation 10, if desired, avoids creating a parasitic channel between the N-type wells of two adjacent low voltage P-channel transistors.

Thus, to form the wells of low voltage N- and P-channel transistors, a capacitor electrode area, and stop-channel regions, a conventional method requires four successive masking and implantation-diffusion steps.

SUMMARY OF THE INVENTION

An object of the present invention is to provide a method of manufacturing semiconductor devices including areas in which capacitors, N-channel and P-channel low voltage transistors, and high voltage transistors are to be formed which is less expensive and shorter.

To achieve this and other objects, the present invention provides a method of manufacturing in a substrate of a first conductivity type including active areas separated by field oxide areas, heavily-doped stop-channel regions under portions of the field insulation areas, more lightly-doped areas of a first and of a second conductivity type meant to form MOS transistor wells, and heavily-doped areas of the second conductivity type meant to form the first electrode of a capacitor. This method includes the steps of performing, through the openings of a first mask, a first high energy backward implantation of the second conductivity type in MOS transistor areas of a first conductivity type; performing, through the openings of a second mask, a second high energy backward implantation of the first conductivity type in MOS transistor areas of a second conductivity type; performing, through the openings of a third mask, a third high energy backward implantation of the first conductivity type in stop-channel areas and in capacitor areas; and performing, through the openings of the third mask, a fourth low energy implantation of the second conductivity type, this fourth implantation being masked by the field oxide.

According to an embodiment of the present invention, the third implantation is performed at an energy of 240-keV.

According to an embodiment of the present invention, the fourth implantation is performed at an energy of 80-keV.

The foregoing objects, features and advantages of the present invention will be discussed in detail in the following non-limiting description of specific embodiments in connection with the accompanying drawings.

BRIEF DESCRIPTION OF THE DRAWINGS

FIGS. 1 to 4 illustrate steps of a conventional method; and

FIGS. 5 to 7 illustrate steps of a method according to the present invention.

DETAILED DESCRIPTION

For clarity, and as usual in the representation of integrated circuits, the different drawings are not to scale. Further, the same elements are designated by same references.

FIG. 5 to 7 show simplified cross-section views illustrating successive steps of an embodiment of a method according to the present invention of manufacturing, in the same substrate, a first electrode of a capacitor, wells of low voltage transistors, and stop-channel regions.

As illustrated in FIG. 5, the process starts from a P-type semiconductor substrate 10 in which active areas have been defined between field oxide areas 12. A first mask 13 is deposited and etched to only expose the active areas in which low voltage P-channel transistors are to be formed. Then, an N-type backward implantation at very high energy, for example, on the order of 1 MeV, is performed through the openings of this first mask, to create wells 14 of low voltage P-channel transistors. This implantation crosses the thick oxide. Mask 13 is identical to mask 5 of FIG. 2 (the second mask of the conventional method) and, similarly, the provision of portions of mask 13 between wells 14 is optional.

At the next steps, illustrated in FIG. 6, first mask 13 is removed and replaced with second mask 15. Second mask 15 is opened to only expose the areas in which the N-channel low voltage transistors are to be formed. Then, a P-type backward implantation at high energy, for example, on the order of 600 keV, is performed through the openings of this second mask 15, to create wells 16 of low voltage N-channel transistors. This implantation crosses the thick oxide. Mask 15 is identical to mask 7 of FIG. 2 (the third mask of the conventional method).

At the next steps, illustrated in FIG. 7, second mask 15 is removed, a third mask 17 is deposited and opened to expose portions of field oxide areas 12 separating two high voltage transistors, as well as to expose the area in which a capacitor electrode is to be formed. Mask 17 can also be opened, as shown, in areas separating wells 14 of two low voltage P-channel transistors. Then, a P-type backward implantation at high energy, for example, on the order of 400 keV, is performed through the openings of this third mask 17. This implantation crosses the thick oxide. This implantation forms heavily-doped stop-channel regions 18-1 and a doped area 18-2 in the area in which the capacitor is to be formed. Then, an N-type implantation at low energy, for example, on the order of 80 keV, is performed through the same mask 17. This implantation being performed at low energy, the dopant does not cross the portions of field oxide area 12 exposed by third mask 17 and thus does not modify the doping of the underlying heavily-doped stop-channel regions 18-1.

Thus, to form the wells of low voltage N- and P-channel transistors, a capacitor electrode area, and stop-channel regions, the method according to the present invention does not require more than three successive masking and implantation-diffusion steps.

The method according to the present invention thus has the advantage of eliminating one step sequence including depositing, then removing a mask (mask 3 of FIG. 1) meant to enable the implantation of the capacitor electrode area.

The structure according to the present invention has the advantage that stop-channel regions 18-1 are now only located in the areas of the high and low voltage transistors between two adjacent transistors, under field oxide areas 12. This decreases the risks of doping profile modification in the wells of these transistors.

Further, in the active area located to the left of the drawing, in which a high voltage N-channel MOS transistor is desired to be formed, the present invention does not need implantation 10 described in relation with FIG. 4. This enables further improving the breakdown voltage of the high voltage transistor.

Of course, the present invention is likely to have various alterations, modifications, and improvements which will readily occur to those skilled in the art. In particular, although the present invention has been described in the context of a specific embodiment (N-type electrodes and P$^+$-type stop-channel areas in a P-type substrate), it also applies to the formation of N$^+$-type stop-channel areas and of P-type capacitor electrodes in an N-type substrate.

As an example, in a specific embodiment of the present invention, the successive implantations may be performed as follows:

implantation of the N wells through mask 13: phosphorus, $10^{13}$ at./cm$^2$, 1.2 MeV implantation of the N wells through mask 15: boron, $10^{13}$ at./cm$^2$, 700 keV P-type implantation through mask 17: boron, $3.5 \times 10^{12}$ at./cm$^2$, 240 keV N-type implantation (19) through mask 17: phosphorus, $10^{14}$ at./cm$^2$, 80 keV.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing in a substrate of a first conductivity type including active areas separated by field oxide areas, heavily-doped stop-channel regions under portions of the field insulation areas, more lightly-doped areas of a first and of a second conductivity type meant to form MOS transistor wells, and heavily-doped areas of the second conductivity type meant to form the first electrode of a capacitor, including the steps of:

performing, through the openings of a first mask, a first high energy backward implantation of the second conductivity type in MOS transistor areas of a first conductivity type;

performing, through the openings of a second mask, a second high energy backward implantation of the first conductivity type in MOS transistor areas of a second conductivity type;

performing, through the openings of a third mask, a third high energy backward implantation of the first conductivity type in stop-channel areas and in capacitor areas; and performing, through the openings of the third mask, a fourth low energy implantation of the second conductivity type, this fourth implantation being masked by the field oxide.

2. The method of claim 1, wherein the third implantation is performed at an energy 240-keV.

3. The method of claim 1 or 2, wherein the fourth implantation is performed at an energy of 80-keV.

* * * * *

UNITED STATES PATENT AND TRADEMARK OFFICE
CERTIFICATE OF CORRECTION

PATENT NO. : 6,156,609
DATED : December 5, 2000
INVENTOR(S) : Jean-Micyhel Mirabel It is certified that error appears in the above-identified patent and that said Letters Patent is hereby corrected as shown below:

Title page,
Item 30 should read:
[30] Foreign Application Priority Data
Apr. 28, 1998     [FR]     France......................98 05628

Signed and Sealed this

Twenty fifth Day of September, 2001

Attest:

*Attesting Officer*

NICHOLAS P. GODICI
*Acting Director of the United States Patent and Trademark Office*